United States Patent
Namkung et al.

(10) Patent No.: US 9,870,023 B2
(45) Date of Patent: Jan. 16, 2018

(54) DISPLAY PANEL AND METHOD OF MANUFACTURING THE SAME

(71) Applicant: SAMSUNG DISPLAY CO., LTD., Yongin, Gyeonggi-Do (KR)

(72) Inventors: Jun Namkung, Asan-si (KR); Soonryong Park, Sejong (KR); Chulwoo Jeong, Hwaseong-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 117 days.

(21) Appl. No.: 14/719,418

(22) Filed: May 22, 2015

(65) Prior Publication Data
US 2016/0170443 A1    Jun. 16, 2016

(30) Foreign Application Priority Data
Dec. 12, 2014  (KR) ........................ 10-2014-0179598

(51) Int. Cl.
*G02B 5/30* (2006.01)
*G06F 1/16* (2006.01)
*H01L 51/00* (2006.01)

(52) U.S. Cl.
CPC ............. *G06F 1/16* (2013.01); *G02B 5/3033* (2013.01); *G06F 1/1652* (2013.01); *H01L 51/0097* (2013.01)

(58) Field of Classification Search
CPC ............... H01L 51/56; H01L 2251/566; H01L 2251/5338; H01L 51/0097; G06F 1/16; G06F 1/1652; G01B 5/3033
See application file for complete search history.

(56) References Cited

U.S. PATENT DOCUMENTS

| 8,349,194 B2* | 1/2013 | Paek | G02F 1/167 216/13 |
| 8,557,067 B2* | 10/2013 | Kataoka | H01L 51/56 156/250 |
| 2007/0138949 A1* | 6/2007 | Yoshida | H01L 51/56 313/504 |
| 2008/0220151 A1* | 9/2008 | Kataoka | H01L 51/56 427/66 |
| 2008/0277375 A1* | 11/2008 | Paek | G02F 1/167 216/17 |

(Continued)

FOREIGN PATENT DOCUMENTS

| KR | 10-2006-0055608 A | 5/2006 |
| KR | 10-2011-0039649 A | 4/2011 |

(Continued)

*Primary Examiner* — Mary Wilczewski
(74) *Attorney, Agent, or Firm* — Lee & Morse P.C.

(57) ABSTRACT

A method of manufacturing a display panel, including providing a plurality of display substrates spaced apart from each other by a predetermined area disposed therebetween when viewed in a plan view, each of the display substrates including a display area, on which an image is displayed, and each of the display substrates being flexible; attaching a first film onto the display substrates to overlap with the display substrates; attaching a second film onto the first film; and substantially and simultaneously cutting the first and second films along a cutting line defined in an area overlapping with the predetermined area.

10 Claims, 15 Drawing Sheets

(56) References Cited

U.S. PATENT DOCUMENTS

| | | | | |
|---|---|---|---|---|
| 2010/0035505 | A1* | 2/2010 | Ishii | H01L 51/56 445/25 |
| 2010/0141135 | A1* | 6/2010 | Kase | G02F 1/133351 313/512 |
| 2010/0253225 | A1* | 10/2010 | Lifka | A61N 5/0616 315/112 |
| 2012/0009702 | A1* | 1/2012 | Cho | H01L 51/56 438/28 |
| 2013/0011969 | A1* | 1/2013 | Chen | H01L 51/003 438/111 |
| 2013/0042735 | A1* | 2/2013 | Lim | B26D 1/15 83/56 |
| 2015/0280127 | A1* | 10/2015 | Suzuki | H01L 51/003 438/33 |
| 2015/0331508 | A1* | 11/2015 | Nho | G06F 3/0421 345/173 |
| 2016/0111480 | A1* | 4/2016 | Suzuki | H01L 51/003 257/93 |
| 2016/0170443 | A1* | 6/2016 | Namkung | G02B 5/3033 359/483.01 |
| 2017/0032763 | A1* | 2/2017 | Cheong | G09G 5/14 |

FOREIGN PATENT DOCUMENTS

| | | |
|---|---|---|
| KR | 10-2011-0047654 A | 5/2011 |
| KR | 10-2013-0004278 A | 1/2013 |
| KR | 10-2013-0102451 A | 9/2013 |
| KR | 10-2016-0028611 A | 3/2016 |

* cited by examiner

DISPLAY PANEL AND METHOD OF MANUFACTURING THE SAME

CROSS-REFERENCE TO RELATED APPLICATION

Korean Patent Application No. 10-2014-0179598, filed on Dec. 12, 2014, and entitled: "Display Panel and Method of Manufacturing the Same," is incorporated by reference herein in its entirety.

BACKGROUND

1. Field

The present disclosure relates to a display panel and a method of manufacturing the same.

2. Description of the Related Art

A flexible display device may include a flexible display panel formed by forming a display part and lines on a flexible substrate and displaying an image even though the flexible display panel may be bent similar to a sheet of paper.

SUMMARY

Embodiments may be realized by providing a method of manufacturing a display panel, including providing a plurality of display substrates spaced apart from each other by a predetermined area disposed therebetween when viewed in a plan view, each of the display substrates including a display area, on which an image is displayed, and each of the display substrates being flexible; attaching a first film onto the display substrates to overlap with the display substrates; attaching a second film onto the first film; and substantially and simultaneously cutting the first and second films along a cutting line defined in an area overlapping with the predetermined area to form a first flexible substrate and a second flexible substrate. Each of the first and second flexible substrates may overlap with one of the display substrates.

An edge portion of the first flexible substrate and an edge portion of the second flexible substrate may be aligned with each other when viewed in a cross-sectional view.

Cutting the first and second films may include using a laser beam or pressure.

The first film may be an optical clear adhesive film.

Attaching the second film may include disposing the second film on the first film; and applying a heat to the second film to allow the first film to be adhered to the display substrates and the second film.

The second film may be a touch panel including a plurality of touch areas disposed to respectively correspond to the display substrates.

The method may further include attaching a third flexible substrate to the second film after attaching the second film and before cutting the first and second films. The third flexible substrate may be substantially simultaneously cut with the first and second films.

Providing the display substrates may further include cutting a mother substrate, the mother substrate including a base layer and a plurality of cells on the base layer and spaced apart from each other, each of the cells defining the display area. The mother substrate may be cut in a unit of the cells to form the display substrates.

The mother substrate may further include a cover layer on the base layer to cover the cells, and cutting the mother substrate may include substantially simultaneously cutting the base layer and the cover layer to form the display substrates respectively covered by cover substrates, and the cover substrates formed by cutting the cover layer.

Providing the display substrates may further include respectively removing the cover substrates from the display substrates, and the first film may be directly attached to the cells.

The method may further include attaching a third film overlapping with at least one of the display substrates after providing the display substrates; and cutting the third film to form third flexible substrates respectively attached to the display substrates before attaching the first film. The third film may be cut along an edge portion of each of the display substrates.

Embodiments may be realized by providing a display panel, including a flexible display substrate including a display area in which an image is displayed; a first flexible substrate on the flexible display substrate; and a second flexible substrate on the first flexible substrate, an edge portion of the first flexible substrate and an edge portion of the second flexible substrate being aligned when viewed in a cross-sectional view.

The first flexible substrate may be an adhesive film to couple the flexible display substrate to the second flexible substrate.

The second flexible substrate may be a touch panel.

The display panel may further include a third flexible substrate between the first flexible substrate and the flexible display substrate. An edge portion of the third flexible substrate may be aligned with an edge portion of the flexible display substrate when viewed in a cross-sectional view.

The third flexible substrate may be a polarization film.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
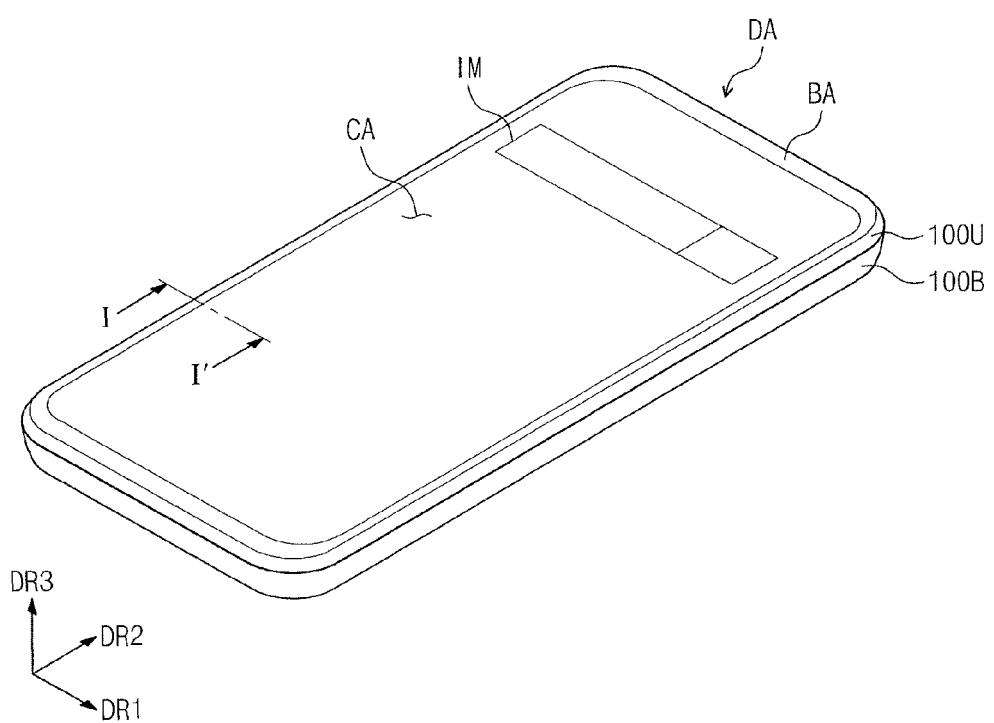
FIG. 1 illustrates a perspective view of a display device according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Like numbers refer to like elements throughout. As used herein, the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
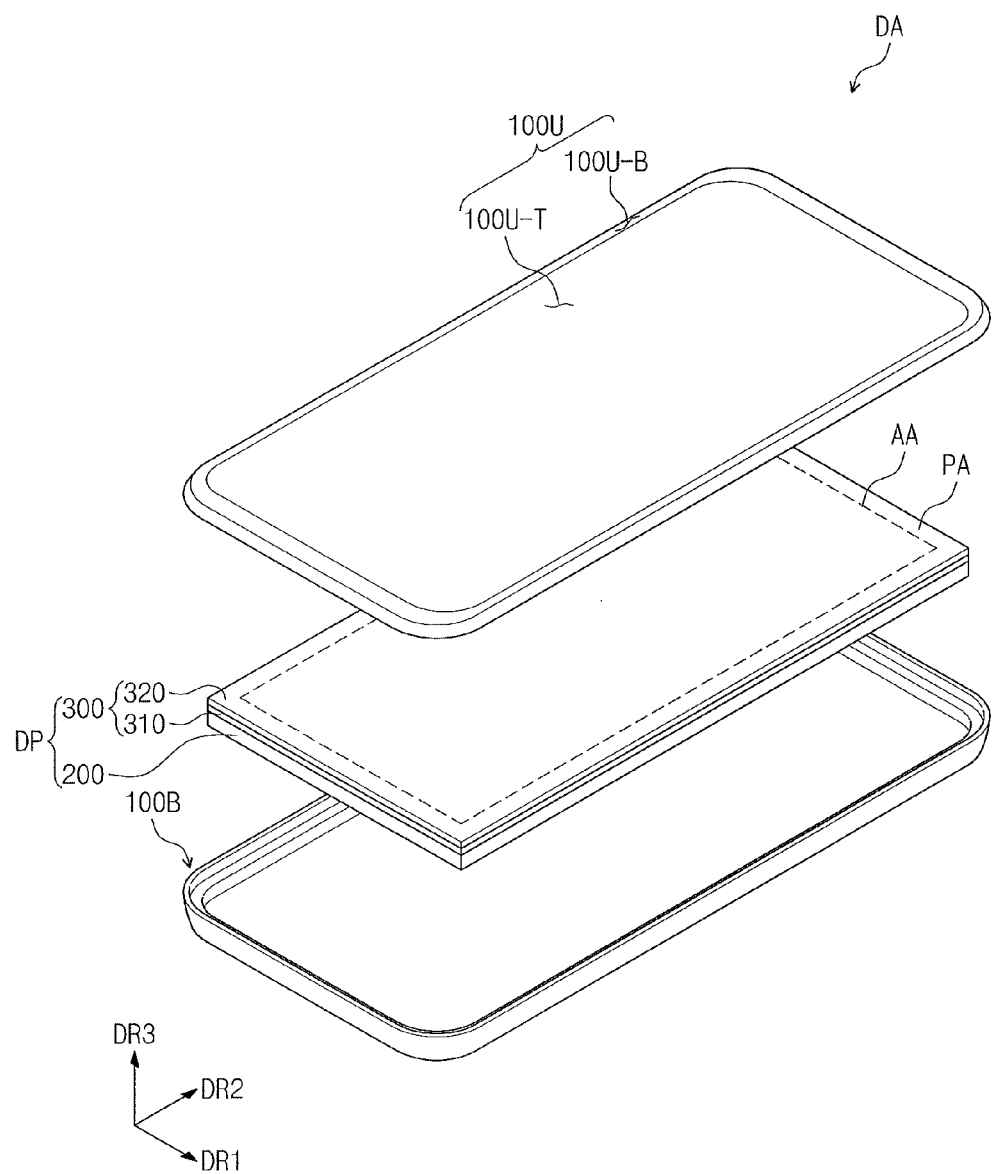
FIG. 2 illustrates an exploded perspective view of the display device shown in FIG. 1.

FIG. 1 illustrates a perspective view of a display device DA according to an exemplary embodiment of the present disclosure and FIG. 2 illustrates an exploded perspective view of the display device DA shown in FIG. 1.

Referring to FIG. 1, the display device DA may include a center area CA and a bezel area BA. The center area CA and the bezel area BA may be distinct from each other on a plane surface defined by a first direction DR1 and a second direction DR2 crossing the first direction DR1.

The center area CA may correspond to a center portion of the display device DA and may be activated when an electrical signal is applied thereto.

For example, an image IM may be displayed through the activated center area CA or the activated center area CA may receive a touch signal from the outside thereof. A user may recognize information from the image IM displayed in the center area CA or may apply the touch signal to the center area CA to drive the display device DA.

The bezel area BA may be disposed along an edge of the center area CA to surround the center area CA. The bezel area BA may have a substantially frame shape when viewed in a plan view.

The image IM may not be displayed in the bezel area BA. The bezel area BA may be defined by protective members 100U and 100B accommodating inner elements of the display device DA or a display panel DP displaying the image IM.

Referring to FIG. 2, the display device DA may include an upper protective member 100U, a lower protective member 100L, and the display panel DP. The upper and lower protective members 100U and 100L may be coupled to each other in an up-and-down direction DR (hereinafter, referred to as a third direction).

The upper and lower protective members 100U and 100B may define an outer shape of the display device DA and may protect the inner elements of the display device DA.

The upper protective member 100U may include a transmission area 100U-T and a blocking area 100U-B. The transmission area 100U-T may define the center area CA and may include a material having high transmittance.

The blocking area 100U-B may block a light such that the inner elements overlapped with the blocking area 100U-B are not perceived from the outside of the display device DA. The blocking area 100U-B may cover areas in which the image IM is not displayed, such as circuits, edge portions of the inner elements.

The blocking area 100U-B may include a material having high light reflectance or high light absorbance. For example, the blocking area 100U-B may include at least one of a metal material, chromium, a colored ink, and carbon.

The upper protective member 100U may have a substantially frame shape corresponding to that of the blocking area 100U-B when viewed in a plan view. The transmission area 100U-T may be provided with an opening formed therethrough.

The blocking area 100U-B may correspond to an area protecting and supporting an upper surface of the display panel DP, and the blocking area 100U-B may have an area enough, e.g., large enough, to support the display panel DP.

The lower protective member 100B may include a bottom portion and a sidewall surrounding the bottom portion. The sidewall may protrude from the bottom portion along the third direction DR3. The bottom portion and the sidewall may define a predetermined inner space.

The upper and lower protective members 100U and 100B may be integrally coupled to each other. For example, the upper protective member 100U may have a frame shape corresponding to the blocking area 100U-B and may be integrally coupled to the lower protective member 100B as a portion of the lower protective member 100B.

When the bezel area BA is defined by the upper and lower protective members 100U and 100B, the bezel area BA may be defined by the blocking area 100U-B, and the bezel area BA may have an area corresponding to that of the blocking area 100U-B when viewed in a plan view.

In the present exemplary embodiment, the upper protective member 100U may be omitted from the display device DA. The lower protective member 100B may accommodate the inner elements of the display device DA.

When the blocking area 100U-B is not separately defined since the upper protective member 100U is omitted, the bezel area BA may be defined by the display panel DP. The shapes of the upper and lower protective members 100U and 100B should not be limited thereto or thereby.

The display panel DP may be accommodated in the inner space. The display panel DP may include an active area AA and a peripheral area PA when viewed in a plan view.

The active area AA may be activated in response to the electrical signals. An area of the active area AA, which may be exposed through the bezel area BA, may correspond to the center area CA.

The peripheral area PA may be disposed adjacent to the active area AA. In the present exemplary embodiment, the peripheral area PA may surround the active area AA.

The display panel DP may have flexibility. For example, the display panel DP may include a flexible display substrate 200 (hereinafter, referred to as a display substrate) and a flexible substrate module 300.

The display substrate 200 may have flexibility. The display substrate 200 may be deformed in various shapes by external force applied thereto. The display substrate 200 may generate the image IM corresponding to the electrical signals.

The display substrate 200 may include a base layer and pixels disposed on the base layer. The base layer may be formed of various plastic materials having softness, e.g., polyethylene terephthalate (PET), polyethylene naphthalate (PEN), polycarbonate (PC), polyethersulfone (PES), polyarylate (PAR), polysulfone (PSF), cyclic-olefin copolymer (COC), polyimide (PI), PI-fluoro-based polymer compound, polyetherimide (PEI), or epoxy resin.

Each pixel may include at least one thin film transistor and a display element connected to the thin film transistor. The display element may generate the light or may control a transmittance of the light passing therethrough to display the image IM.

For example, the display substrate 200 may be a liquid crystal panel including liquid crystals, an organic light emitting panel including an organic light emitting element, an electrophoretic panel including an electrophoretic element, or an electrowetting panel including a fluid.

The flexible substrate module 300 may include a first flexible substrate 310 and a second flexible substrate 320, which may be sequentially arranged in the third direction DR3. The flexible substrate module 300 may be greater, e.g., larger, than the display substrate 200 when viewed in a plan view.

Figure 3A:
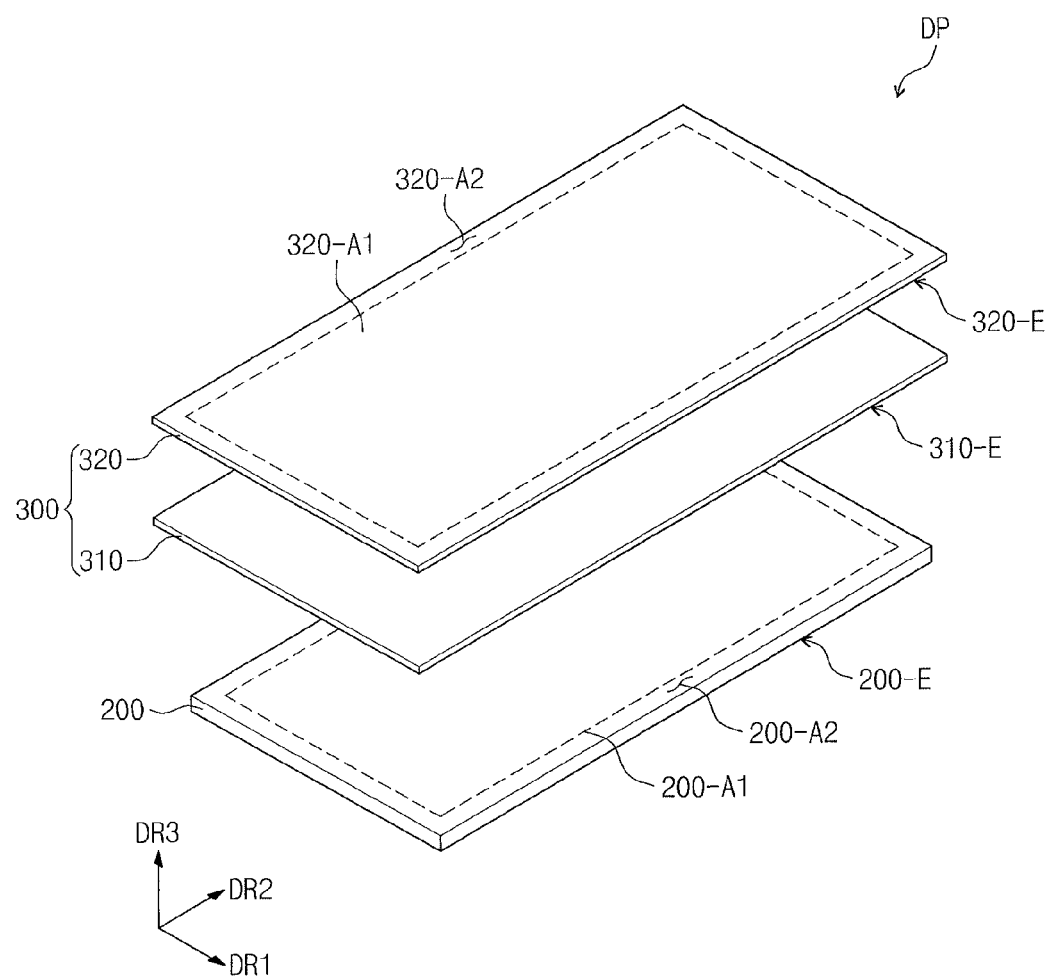
FIG. 3A illustrates an exploded perspective view of a display panel according to an exemplary embodiment of the present disclosure.
Figure 3B:
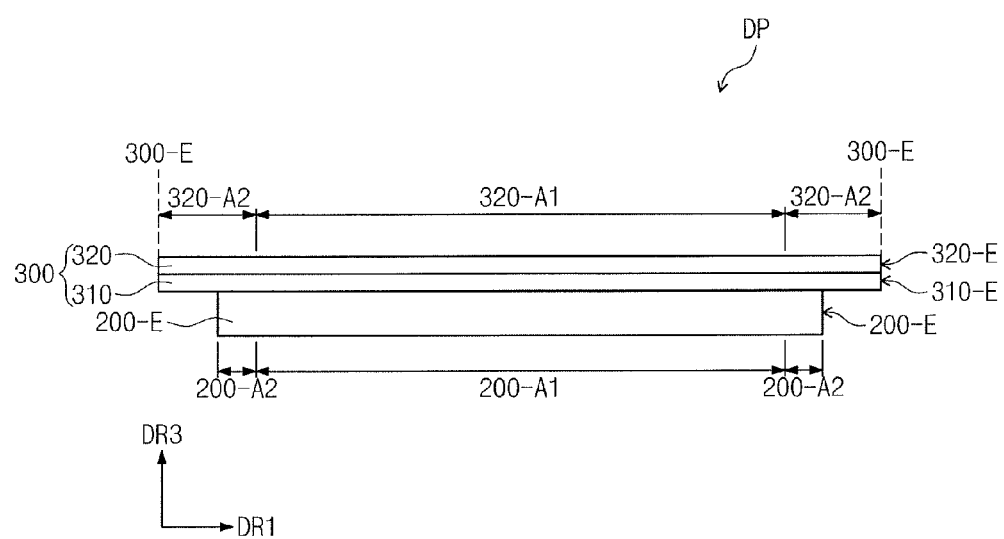
FIG. 3B illustrates a cross-sectional view of the display panel shown in FIG. 3A.

FIG. 3A illustrates an exploded perspective view of a display panel according to an exemplary embodiment of the present disclosure and FIG. 3B illustrates a cross-sectional view of the display panel shown in FIG. 3A.

Referring to FIGS. 3A and 3B, the display substrate 200 may include a display area 200-A1 and a non-display area 200-A2. The display area 200-A1 may include pixels arranged therein. The pixels may display the image IM (refer to FIG. 1) corresponding to the electrical signals.

The non-display area 200-A2 may surround the display area 200-A1. A circuit part may be disposed in the non-display area 200-A2. The circuit part may generate the electrical signals and may apply the electrical signals to the pixels.

In the present exemplary embodiment, the first flexible substrate 310 may be, for example, an optical clear adhesive (OCA) film. The first flexible substrate 310 may be disposed between the display substrate 200 and the second flexible substrate 320 to couple the display substrate 200 and the second flexible substrate 320.

The second flexible substrate 320 may be, for example, a touch panel. The second flexible substrate 320 may include a touch area 320-A1 and a pad area 320-A2.

The touch area 320-A1 may include a plurality of touch patterns disposed therein. The touch patterns may include a conductive material. The touch patterns may sense a touch signal from the outside of the second flexible substrate 320 and may generate a touch sensing signal.

The pad area 320-A2 may surround the touch area 320-A1. The pad area 320-A2 may be an area in which pads connected to the touch patterns are disposed. The touch signal may be applied to the display substrate 200 through the pad area 320-A2, which may be disposed outside of the second flexible substrate 320.

The touch area 320-A1 and the pad area 320-A2 may be defined in the display substrate 200. For example, the display substrate 200 may be a display panel into which a touch screen is integrated. The second flexible substrate 320 may be, for example, an optical film.

FIGS. 3A and 3B show the edge portions of the display substrate 200, the first flexible substrate 310, and the second flexible substrate 320.

The display substrate 200 may have a substantially quadrangular shape with four edges, and the edge portion 200-E may be defined along the four edges. Similarly, an edge portion 310-E of the first flexible substrate 310 may be defined along four edges of the first flexible substrate 310 and an edge portion 320-E of the second flexible substrate 320 may be defined along four edges of the second flexible substrate 320.

In the present exemplary embodiment, the display substrate 200 may be smaller than the flexible substrate module 300, and the edge portion 200-E of the display substrate 200 may be covered by the flexible substrate module 300 when viewed in a plan view.

An edge portion 300-E of the flexible substrate module 300 may be defined in the flexible substrate module 300. The flexible substrate module 300 may include a plurality of substrates, and the edge portion 300-E of the flexible substrate 300 may be defined by the edge portions 310-E and 320-E of the first and second flexible substrates 310 and 320.

The display area 200-A1 and the touch area 320-A1 may be overlapped, e.g., may overlap, with each other in the plan view. An area of the display area 200-A1, which may be overlapped with the touch area 320-A1, may correspond to the active area AA (refer to FIG. 2). The non-display area 200-A2 and the pad area 320-A2 may be overlapped with the peripheral area PA.

FIG. 3B shows the display panel DP that is assembled such that the display area 200-A1 corresponds to the touch area 320-A1. The active area AA, the display area 200-A1, and the touch area 320-A1 may be substantially the same area, e.g., may correspond to a same area, and may have substantially equal areas.

In the present exemplary embodiment, a tolerance between the edge portions 310-E and 320-E may become substantially zero. The tolerance may correspond to a distance between the edge portions 310-E and 320-E when viewed in a plan view.

As shown in FIG. 3B, the edge portion 310-E of the first flexible substrate 310 may coincide with the edge portion 320-E of the second flexible substrate 320. The edge portion 310-E of the first flexible substrate 310 and the edge portion 320-E of the second flexible substrate 320 may be aligned, e.g., in a line, along the third direction DR3, and the edge portion 300-E of the flexible substrate module 300 may be substantially in parallel to, e.g., with, the third direction DR3 when viewed in a cross section.

As the tolerance between the elements is reduced, the elements may be handled as a single unit. In the process of assembling the elements included in the display device, the shape of the display device and the bezel area may be determined depending on the size of each element and the tolerance between the elements adjacent to each other.

For example, the edge portion 300-E of the flexible substrate module 300 may be in a line shape substantially in parallel to the third direction DR3, and the lower protective member 100B (refer to FIG. 2) may be designed in consideration of only the edge portion 300-E of the flexible substrate module and the edge portion 200-E of the display substrate.

To accommodate the display panel DP in the lower protective member 100B, it may not be necessary to separately consider the edge portion 310-E of the first flexible substrate 310 and the edge portion 320-E of the second flexible substrate 320. A design condition may be simplified, and the display panel DP may be stably coupled to the lower protective member 100B according to a fixed standard.

The edge portion 300-E of the flexible substrate module 300 may be in a line shape substantially in parallel to the third direction DR3, and a distance between the edge portion 300-E of the flexible substrate module 300 and a point of the display panel DP may be substantially the same as a distance measured from each of the edge portion 310-E of the first flexible substrate 310 and the edge portion 320-E of the second flexible substrate 320.

For example, a distance from a boundary between the touch area 320-A1 and the pad area 320-A2 to the edge portion 320-E of the second flexible substrate 320 when viewed in a plan view may be substantially the same as a distance from the boundary to the edge portion 310-E of the first flexible substrate 310.

When the blocking area 100U-B (refer to FIG. 2) used to cover the pad area 320-A2 is defined, it may be enough to consider one point of the edge portion 310-E of the first flexible substrate 310 and the edge portion 320-E of the second flexible substrate 320 without considering all the edge portions 310-E and 320-E.

When the elements are assembled to each other and designed, the tolerance between the elements may exert influence on the shape of the display device or on stability in coupling between the elements. As the tolerance between the elements decreases, process errors, which may be caused by coupling the elements to each other, may be improved.

The display device DA according to the present exemplary embodiment may include the flexible substrate having a tolerance of substantially zero, process errors in the assembling process may be reduced, and a production yield may be improved.

Figure 4A:
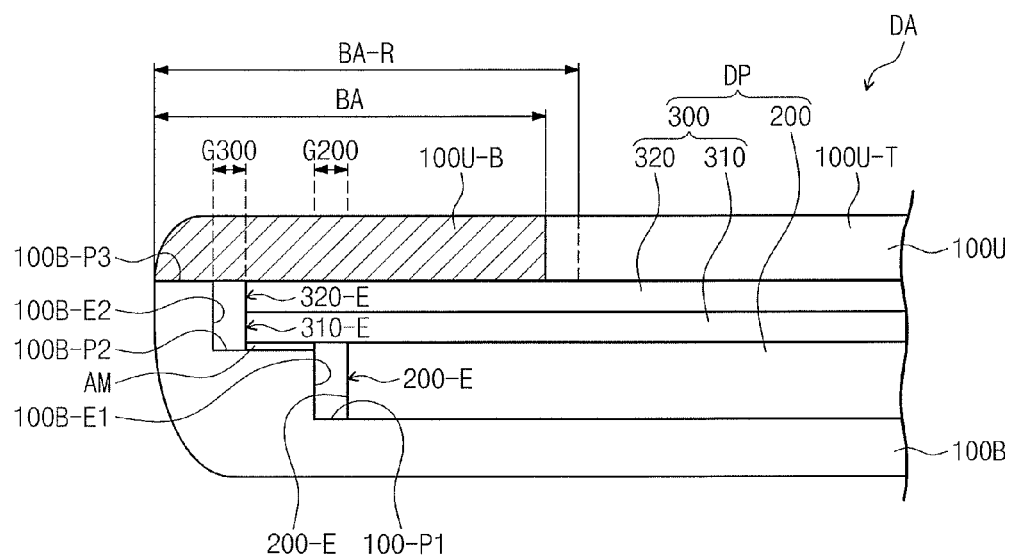
FIG. 4A illustrates a cross-sectional view of a portion of a display device according to an exemplary embodiment of the present disclosure.
Figure 4B:
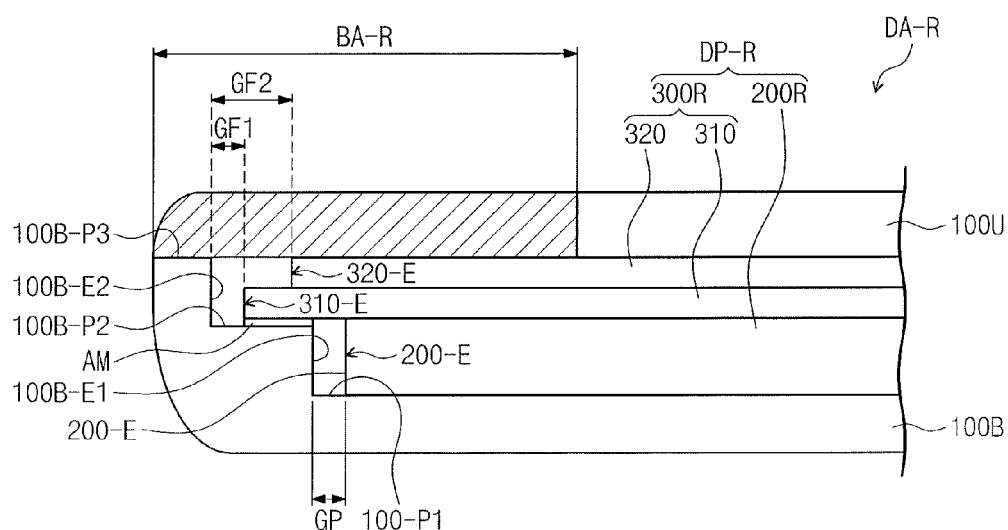
FIG. 4B illustrates a cross-sectional view of a portion of a display device according to a comparative example.

FIG. 4A illustrates a cross-sectional view of a portion of a display device according to an exemplary embodiment of the present disclosure and FIG. 4B illustrates a cross-sectional view of a portion of a display device according to a comparative example. The cross-sectional views shown in FIGS. 4A and 4B correspond to the cross-section taken along the line I-I' of FIG. 1.

The display device according to the comparative example may have the same structure and function as those of the display device according to the present exemplary embodiment except for a display panel DP-R (hereinafter, referred to as a comparative display panel) and a blocking area BA-R (hereinafter, referred to as a comparative blocking area). In FIGS. 4A and 4B, the same reference numerals may denote the same elements in FIGS. 1 to 3B, and detailed descriptions of the same elements will be omitted.

The lower protective member 100B may include a plurality of surfaces therein. The surfaces may include a first plane surface 100B-P1, a second plane surface 100B-2, a third plane surface 100B-3, a first side surface 100B-E1, and a second side surface 100B-E2.

The display substrate 200 may be disposed on the first plane surface 100B-P1. The first plane surface 100B-P1 may have a size equal to or greater, e.g., larger, than that of the display substrate 200 when viewed in a plan view.

The display device DA may further include an adhesive member disposed between the first plane surface 100B-P1 and the display substrate 200. The first plane surface 100B-P1 and the display substrate 200 may be coupled to each other by the adhesive member. The display panel DP may be more stably accommodated in the lower protective member 100B.

A portion of the flexible substrate module 300 may be disposed on the second plane surface 100B-P2. The second plane surface 100B-P2 may support the portion of the flexible substrate module 300, which may protrude from the edge portion 200-E of the display substrate 200.

An adhesive member AM may be further disposed between the second plane surface 100B-P2 and the flexible substrate module 300. The adhesive member AM may fix the flexible substrate module 300 to the lower protective member 100B, a coupling force between the lower protective member 100B and the display panel DP may be improved, and the lower protective member 100B may stably accommodate the display panel DP.

The third plane surface 100B-P3 may support a portion of the upper protective member 100U. The first side surface 100B-E1 may face each of the display substrate 200 and a display substrate 200R of the comparative example.

The second side surface 100B-E2 may connect the second plane surface 100-P2 and the third plane surface 100B-P3. The second side surface 100B-E2 may face each of the flexible substrate module 300 and a flexible substrate module 300R of the comparative example.

As shown in FIG. 4A, the display substrate 200 may be spaced apart from the first side surface 100B-E1 by a first distance G200 and accommodated in the lower protective member 100B. The first distance G200 may correspond to a shortest distance between the edge portion 200-E of the display substrate 200 and the first side surface 100B-E1.

The flexible substrate module 300 may be spaced apart from the second side surface 100B-E2 by a second distance G300 and accommodated in the lower protective member 100B. The second distance G300 may correspond to a shortest distance between the edge portion 300-E of the flexible substrate module 300 and the second side surface 100B-E2. The first and second distances G200 and G300 may correspond to a standard value set to assemble the display device DA.

As described above, the tolerance between the edge portion 310-E of the first flexible substrate 310 and the edge portion 320-E of the second flexible substrate 320 may be substantially zero, and the distance between the first flexible substrate 310 and the second side surface 100B-E2 may be substantially equal to the distance between the second flexible substrate 320 and the second side surface 100B-E2. In the present exemplary embodiment, the first and second flexible substrates 310 and 320 may be spaced apart from the second side surface 100B-E2 by the second distance G300.

Referring to FIG. 4B, the display panel DR-R according to the comparative example may include the display substrate 200 and the flexible substrate module 300R having a tolerance with respect to the display substrate 200. The edge portions of the flexible substrate module 300R may not be aligned, e.g., in a line, when viewed in a cross-sectional view.

In the flexible substrate module 300R having a tolerance, the edge portion 310-E of the first flexible substrate 310 and the edge portion 320-E of the second flexible substrate 320 may not be aligned with each other, and the first flexible substrate 310 of the comparative example may be spaced apart from the second side surface 100B-E2 by a distance different from a distance between the second flexible substrate 320 and the second side surface 100B-E2.

For example, although the distance GP between the edge portion 200-E of the display substrate and the first side surface 100B-E1 may be substantially equal to the first distance G200 and the distance GF1 between the first flexible substrate 310 of the comparative example and the second side surface 100B-E2 may be substantially equal to the second distance G300, the distance GF2 between the second flexible substrate 320 and the second side surface 100B-E2 may become different from the standard range.

As described above, the first and second flexible substrates 310 and 320 of the comparative example may be accommodated in the lower protective member 100B such that the first and second flexible substrates 310 and 320 of the comparative example are spaced apart from the second side surface 100-E2 by different distances, and a bezel area BA-R of the comparative example may become different from the bezel area BA according to the present exemplary embodiment.

As shown in FIG. 4B, the bezel area BA-R of the comparative example may be greater than that of the bezel area BA. In the display device DA-R according to the comparative example, the edge portion of the second flexible substrate 320 may move to inside, e.g., move inward, from the edge portion of the first flexible substrate 310, and a boundary between a peripheral area and an active area of the second flexible substrate 320 may move to inside, e.g., move inward.

The blocking area 100U-B of the display device may have a shape covering at least the boundary between the peripheral area and the active area. When the boundary between the peripheral area and the active area moves inside of the display device, the area of the blocking area 100U-B may increase to cover the boundary between the peripheral area and the active area.

The blocking area 100U-B may determine the bezel area of the display device, the display device DA may include the flexible substrate module 300 having a tolerance of about zero, and the bezel area BA may be reduced. Although plural display devices may be used, the bezel areas corresponding to the boundaries between the display devices may not be perceived by the user, and the display device DA according to the present exemplary embodiment may be applied to a multi-display system, e.g., a tiled display system.

Figure 5A:
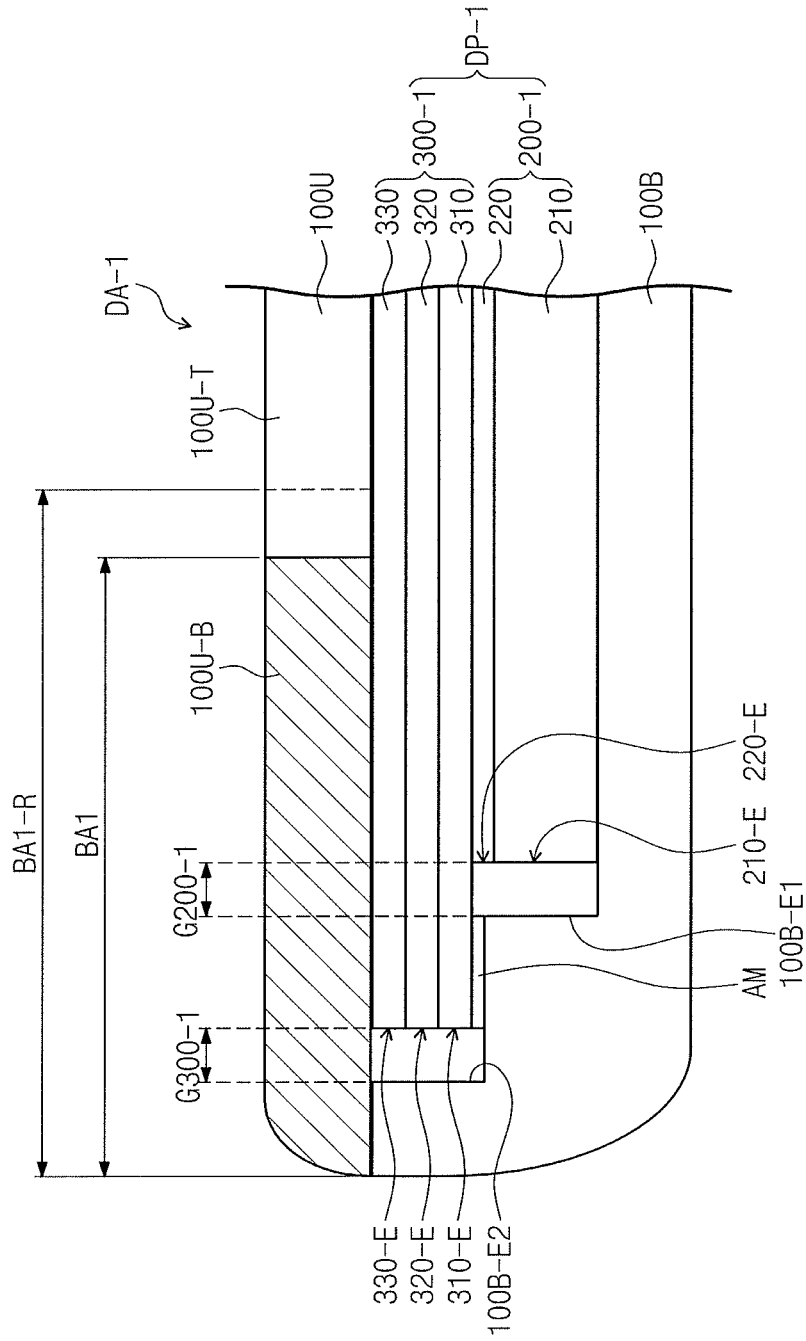
FIG. 5A illustrates a cross-sectional view of a portion of a display device according to an exemplary embodiment of the present disclosure.
Figure 5B:
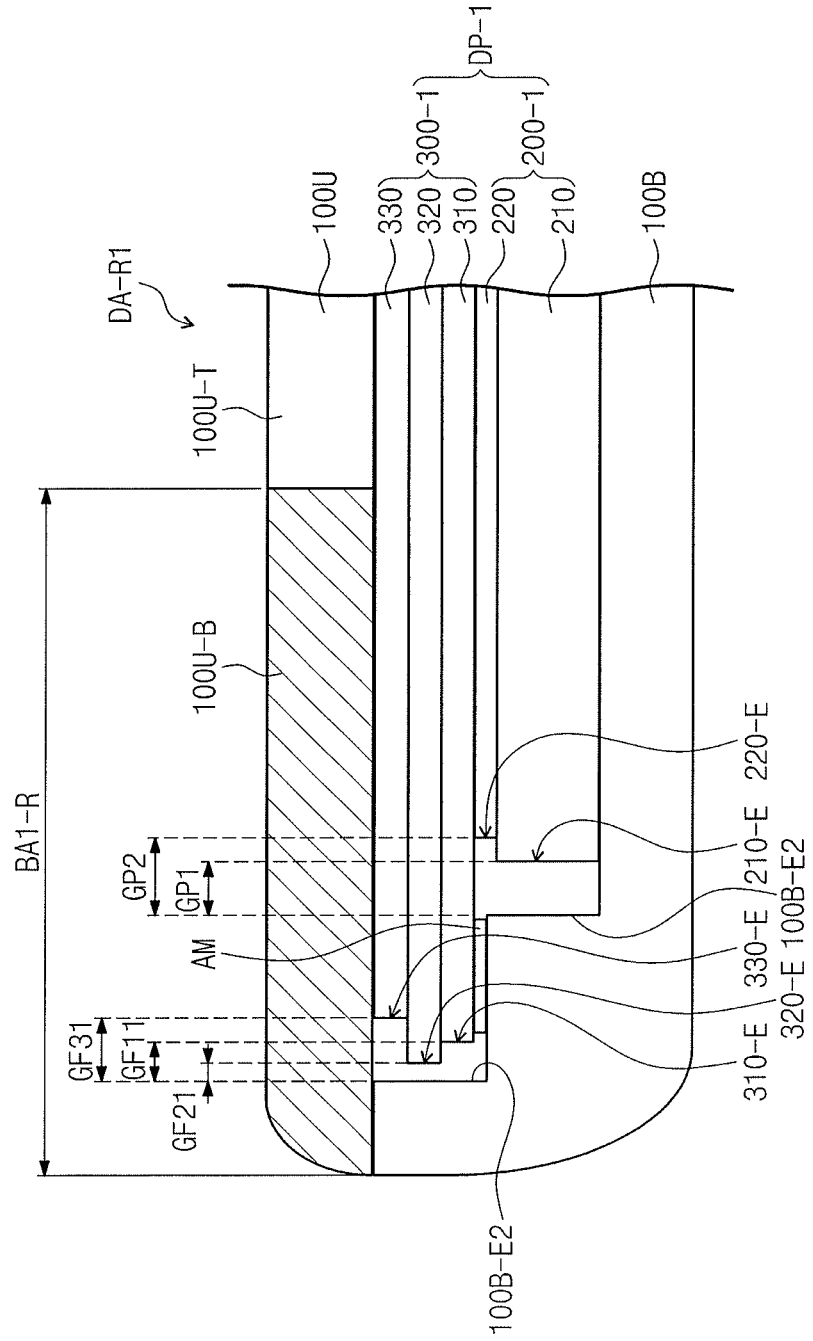
FIG. 5B illustrates a cross-sectional view of a portion of a display device according to a comparative example.

FIG. 5A illustrates a cross-sectional view of a portion of a display device according to an exemplary embodiment of the present disclosure and FIG. 5B illustrates a cross-sectional view of a portion of a display device according to a comparative example. In FIGS. 5A and 5B, the same reference numerals may denote the same elements in FIGS. 1 to 4B, and detailed descriptions of the same elements will be omitted.

Referring to FIG. 5A, a display panel DP-1 may include a display substrate module 200-1 and a flexible substrate module 300-1. The display substrate module 200-1 may include a display substrate 210 and a third flexible substrate 220. The display substrate 210 may correspond to the display substrate 200 shown in FIG. 4A.

The third flexible substrate 220 may be disposed between the display substrate 210 and the flexible substrate module 300-1. The third flexible substrate 220 may be attached to the display substrate 210 by an adhesive member.

The third flexible substrate 220 may be, for example, an optical member. For example, the third flexible substrate 220 may be a polarization film, a reflection prevention film, or a retardation film. The third flexible substrate 220 may improve a display quality of the display substrate 210.

The display substrate module 200-1 may be spaced apart from the first side surface 100B-E1 by a first distance G200-1 and accommodated in the lower protective member 100B. The first distance G200-1 may have a value within a predetermined range.

The tolerance between an edge portion 220-E of the third flexible substrate 220 and the edge portion 210-E of the display substrate 210 may become zero. The edge portion 220-E of the third flexible substrate and the edge portion 210-E of the display substrate 210 may be spaced apart from a first side surface 310B-E1 by the first distance G200-1.

As described later, the edge portion 220-E of the third flexible substrate 220 and the edge portion 210-E of the display substrate 210 may be substantially simultaneously formed, and the edge portion 220-E of the third flexible substrate 220 and the edge portion 210-E of the display substrate 210 may be aligned, e.g., in a line, along the third direction DR3.

The flexible substrate module 300-1 may further include a fourth flexible substrate 330. An edge portion 330-E of the fourth flexible substrate 330 may be aligned with the edge portion 310-E of the first flexible substrate 310 and the edge portion 320-E of the second flexible substrate 320.

The tolerance between the edge portion 310-E of the first flexible substrate 310, the edge portion 320-E of the second flexible substrate 320, and the edge portion 330-E of the fourth flexible substrate 330 may become zero, and the flexible substrate module 300-1 may have the edge portions aligned, e.g., in a line, when viewed in a cross-sectional view.

The edge portion 310-E of the first flexible substrate 310, the edge portion 320-E of the second flexible substrate 320, and the edge portion 330-E of the fourth flexible substrate 330 may be spaced apart from the second side surface 100B-E2 by the same distance. The flexible substrate module 300-1 may be spaced apart from the second side surface 100B-E2 by a second distance g300-1 and accommodated in the lower protective member 100B. The second distance G300-1 may have a value within a predetermined range.

Each of the display substrate module 200-1 and the flexible substrate module 300-1 according to the present exemplary embodiment may have a tolerance of about zero, the blocking area 100-B may be determined in consideration of only the first and second distances G200-1 and G300-1, and the assembling process may be simplified.

Referring to FIG. 5B, a display device DA-R1 according to the comparative example may include a display substrate module 200R-1 having tolerance and a flexible substrate module 300R-1 having tolerance. The display substrate module 200R-1 may have the same configurations as those of the display substrate module 200-1 but may have tolerance, and the flexible substrate module 300R-1 may have the same configurations as those of the flexible substrate module 300-1 but may have tolerance. Detailed descriptions of the same elements will be omitted.

An edge portion of the display substrate module 200R-1 having tolerance may not be aligned, e.g., in a line. The tolerance may exist between the edge portion 210-E of the display substrate 210 and the edge portion 220-E of the third flexible substrate 220.

A distance GP1 between the first side surface 100B-E1 and the edge portion 210-E of the display substrate 210 may be different from a distance GP2 between the first side surface 100B-E1 and the edge portion 220-E of the third flexible substrate 220, and although the distance GP1 between the first side surface 100B-E1 and the edge portion 210-E of the display substrate 210 may be set to correspond to the first distance G200-1 that is in the standard range, the distance GP2 between the first side surface 100B-E1 and the edge portion 220-E of the third flexible substrate 220 may deviate from the standard range, and the tolerance, i.e., the process errors, may be caused.

The edge portion of the flexible substrate module 300R-1 having a tolerance may not be aligned, e.g., in a line, along when viewed in the third direction D3, and a tolerance may exist between the edge portion 310-E of the first flexible substrate 310, the edge portion 320-E of the second flexible substrate 320, and the edge portion 330-E of the fourth flexible substrate 330.

A distance GF11 between the second side surface 100B-E2 and the edge portion 310-E of the first flexible substrate 310, a distance GF21 between the second side surface 100B-E2 and the edge portion 320-E of the second flexible substrate 320, and a distance GF31 between the second side surface 100B-E2 and the edge portion 330-E of the fourth flexible substrate 330 may be different from each other.

Although one of the distances GF11, GF21, and GF31 may be set to correspond to the second distance G300-1 that is in the standard range, process errors may occur since the other distances of the distances GF11, GF21, and GF31 may deviate from the standard range.

In the display device DA-R1 according to the comparative example, the blocking area 100U-B may be determined in consideration of all the distances GP1, GP2, GP11, GP21, and GP31. The blocking area 100U-B may be determined in consideration of the distances GP2, GF11, and GF31 greater than the minimum distances GP1 and GF21, and the blocking area 100U-B may have an area greater than an area when the blocking area 100U-B is determined in consideration of the minimum distances GP1 and GF21.

The display device DA-1 according to the present exemplary embodiment may include the display substrate module 200-1 and the flexible substrate module 300-1, each having a tolerance of about zero, and the bezel area BA may be reduced.

When the plural elements are assembled to each other to allow the tolerance to become zero, the elements may be may be handled as a single unit. According to the present exemplary embodiment, the process errors in assembling of the display device DA may be reduced, and the design for the display device DA may become easier. The assembling process of the display device DA-1 may be simplified and the production yield of the display device DA-1 may be improved.

The display panel DP-1 according to the present exemplary embodiment may further include a waterproof member (or a sealing member) disposed along the edge portion of the flexible display module 300-1 or the display module 200-1. The waterproof member may prevent external moisture or air from entering the flexible display module 300-1 or the display module 200-1.

For example, the waterproof member may be, for example, an optical clear adhesive (OCA) tape. As described above, the display panel DP may include the edge portions aligned, e.g., in a line, when viewed in a cross-sectional view, and the member, such as the OCA tape, may be easily attached and coupled to the edge portions.

Figure 6:
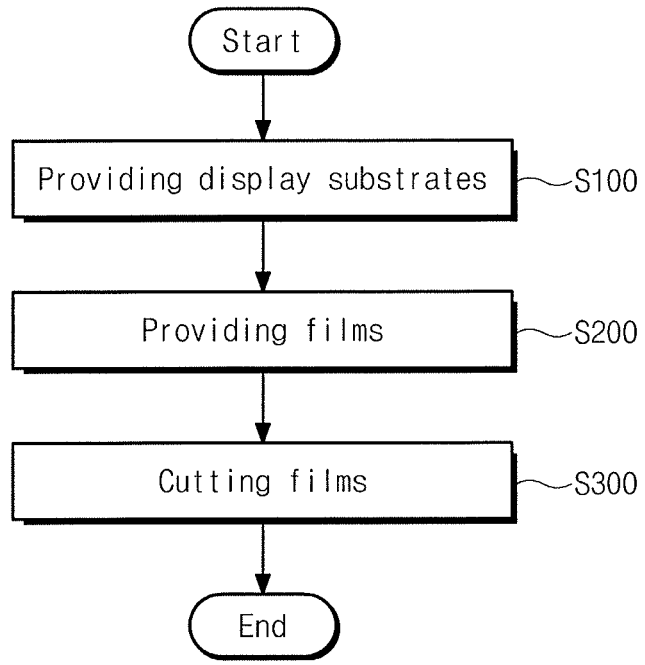
FIG. 6 illustrates a flowchart of a manufacturing method of a display panel according to an exemplary embodiment of the present disclosure.
Figure 7:
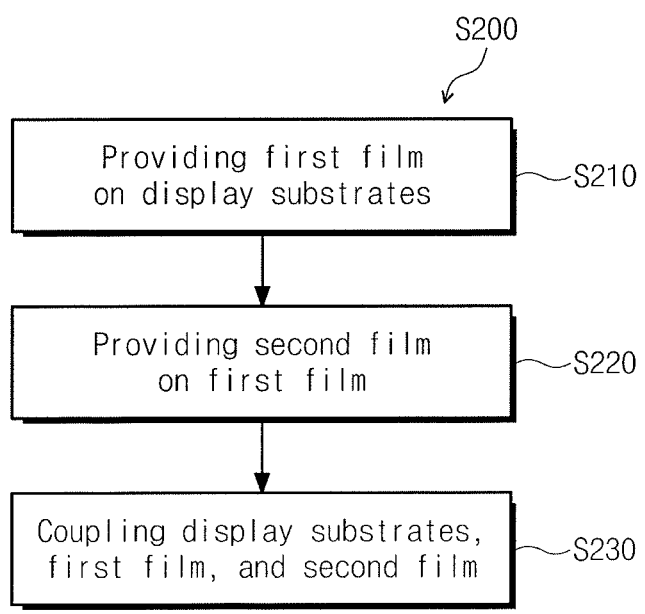
FIG. 7 illustrates a flowchart of a portion of a manufacturing method of a display panel according to an exemplary embodiment of the present disclosure.

FIG. 6 illustrates a flowchart of a manufacturing method of a display panel according to an exemplary embodiment of the present disclosure and FIG. 7 illustrates a flowchart of a portion of a manufacturing method of a display panel according to an exemplary embodiment of the present disclosure.

The manufacturing method of the display panel may include providing a plurality of display substrates (S100), attaching a plurality of flexible mother substrates (S200) and substantially simultaneously cutting the flexible mother substrates to form the display panel (S300).

The display substrates may be disposed such that a predetermined area may be disposed therebetween when viewed in a plan view (S100). The display substrates may be arranged to be spaced apart from each other by a predetermined distance through providing the display substrates (S100).

Providing the display substrates (S100) may further include providing a mother substrate and cutting the mother substrate before the display substrates are arranged.

Attaching the flexible mother substrates (S200) may include a lamination process. The flexible mother substrates may be substantially simultaneously disposed on or sequentially provided on the display substrates.

For example, referring to FIG. 7, attaching the flexible mother substrates (S200) may include providing first films on the display substrates (S210), providing second films on the first films (S220), and attaching the display substrates, the first films, and the second films to each other through the lamination process (S230).

The first films may be an optical adhesive film. The first films may be plastic-deformed through the lamination process, the display substrates may be coupled to the second films, and the first and second films may be substantially simultaneously attached to the display substrates.

In an embodiment, attaching the flexible mother substrates (S200) may include attaching the first films to the display substrates and attaching the second films to the first films.

In an embodiment, for example, the second films may be attached to the first films after the first films are attached onto the display substrates, and the first and second films may be sequentially attached to the display substrates.

FIGS. 8A to 8F illustrate cross-sectional views of a manufacturing method of a display panel according to an exemplary embodiment of the present disclosure. In FIGS. 8A to 8F, the same reference numerals may denote the same elements in FIGS. 1 to 7, and detailed descriptions of the same elements will be omitted.

Figure 8A:
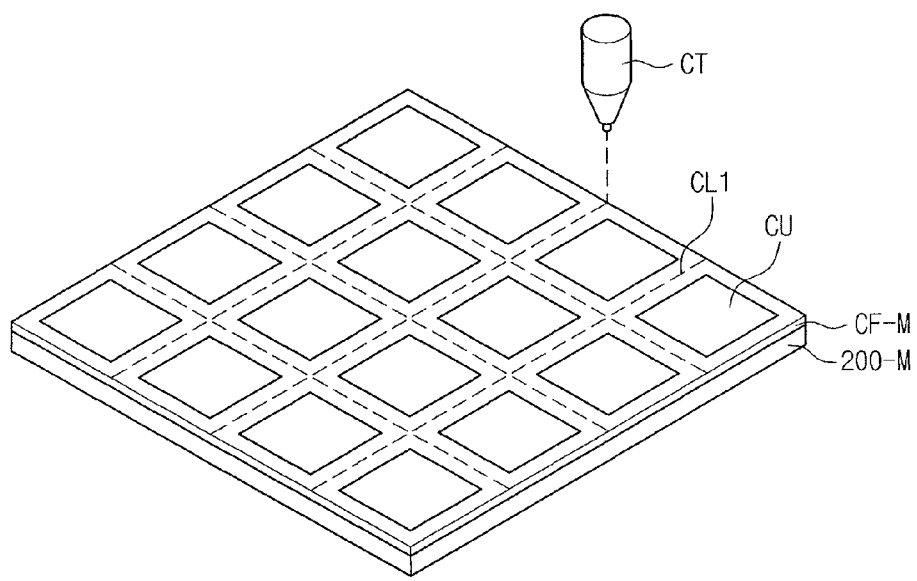
FIGS. 8A to 8F illustrate cross-sectional views of a manufacturing method of a display panel according to an exemplary embodiment of the present disclosure.
Figure 8B:
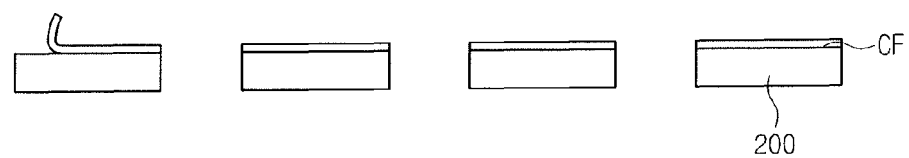

Hereinafter, providing the display substrates by cutting the mother substrate will be described with reference to FIGS. 8A and 8B. However, according to an embodiment, cutting the mother substrate may be omitted from the manufacturing method of the display panel.

A cover substrate CF-M may be disposed on the mother substrate 200-M. The cover substrate CF-M may be attached to an upper surface of the mother substrate 200-M.

The cover substrate CF-M may cover the entire surface of the mother substrate 200-M. The cover substrate CF-M may prevent the mother substrate 200-M from being damaged or contaminated during the manufacturing process.

The mother substrate 200-M may include a plurality of cells CU. For the convenience of explanation, FIG. 8A shows the cells CU represented on the cover substrate CF-M.

The cells CU may be spaced apart from each other and arranged in a matrix form. Each of the cells CU may include a plurality of pixels. Each of the cells CU may define the display area 200-A1 (refer to FIG. 3A).

The mother substrate 200-M may be cut along a cutting line CL1 defined between the cells CU, the display substrate 200 may correspond to a unit mother substrate obtained by cutting the mother substrate in the unit of cell, and one display substrate 200 may include one display area.

The display substrate 200 may be provided while being attached with a cover film CF. The cover film CF may be formed by cutting the cover substrate CF-M along the cutting line CL1. Then, the cover film CF may be peeled off from the display substrate 200 for a next process.

Figure 8C:
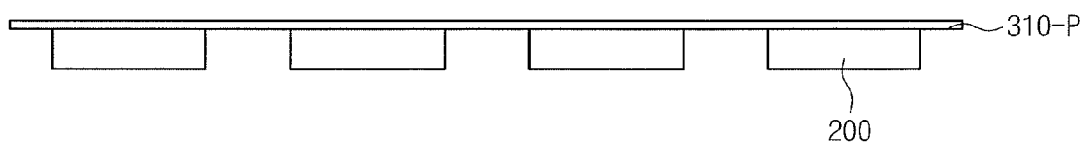

Referring to FIG. 8C, a first film 310P may be disposed on the display substrate 200 after the cover film CF is peeled off. The first film 310P may have a size enough, e.g., a size large enough, to cover the display substrates 200. The first film 310P may be substantially simultaneously provided on the upper surfaces of the display substrates 200.

Figure 8D:
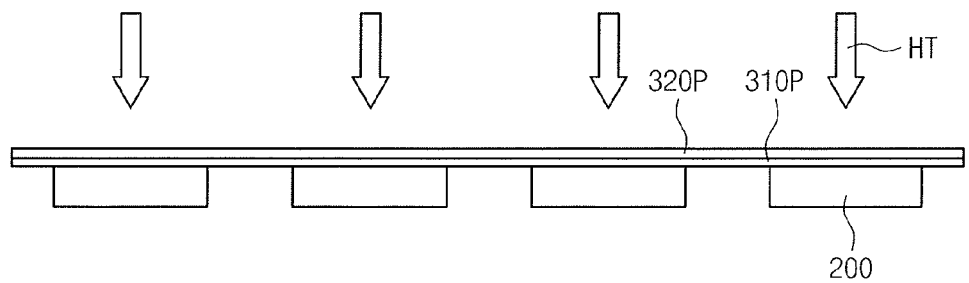

Referring to FIG. 8D, a second film 320P may be provided on the first film 310P. The second film 320P may have a size enough e.g., a size large enough, to cover all the display substrates on which the first film 310P is provided.

Then, a heat HT may be applied to the first and second films 310P and 320P2 to laminate the first and second films 310P and 320P, and the display substrates 200, the first film 310P and the second film 320P may be stably coupled to each other.

For example, the first film 310P may be the optical adhesive film. The first film 310P may be deformed by the heat HT, the first film 310P may have improved adhesion and viscosity, and the coupling force between the second film 320P and the display substrates 200 may be improved.

Figure 8E:
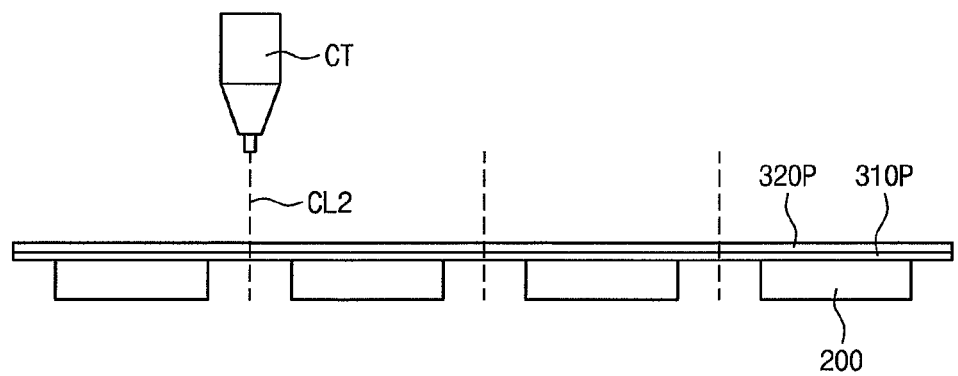
Figure 8F:
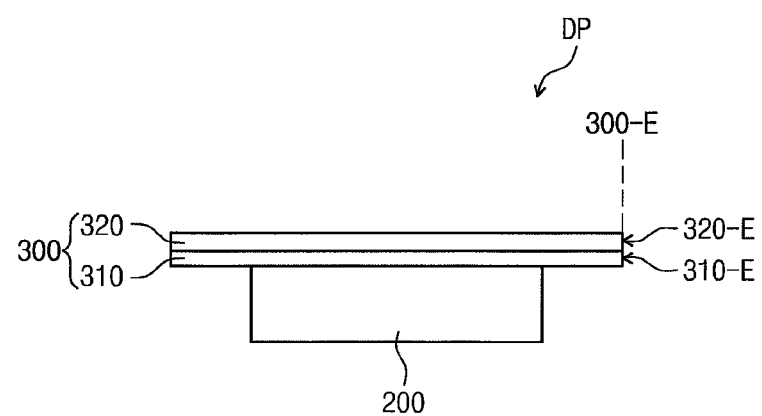

Referring to FIGS. 8E and 8F, the first and second films 310P and 320P may be cut to form the display panel DP. FIG. 8F shows one display panel DP.

As shown in FIG. 8E, the first and second films 310P and 320P may be substantially simultaneously cut along a cutting line CL2 defined in the first and second films 310P and 320P. The cutting line CL2 may be defined in an area between the display substrates 200.

The cutting line CL2 may be defined in an area in which a margin from the edge portion of the display substrate 200 is minimized. As the margin is reduced, the following assembling processes may be performed. A plurality of cutting lines may be defined between two display substrates.

The first and second films 310P and 320P may be cut by a cutting tool CT. The cutting tool CT may cut the first and second films 310P and 320P in various ways.

For example, the cutting tool CT may cut the first and second films 310P and 320P using a laser beam or using pressure. The cutting tool CT may substantially simultaneously cut the flexible films in various ways.

As shown in FIG. 8F, the first and second films 310P and 320P may be cut to form the first and second flexible substrates 310 and 320. The cut portions cut by the cutting tool CT may respectively correspond to the edge portion 310-E of the first flexible substrate and the edge portion 320-E of the second flexible substrate.

The first and second films 310P and 320P may be substantially simultaneously cut, and the edge portion 310-E of the first flexible substrate and the edge portion 320-E of the second flexible substrate may be substantially simultaneously formed. The edge portion 310-E of the first flexible substrate and the edge portion 320-E of the second flexible substrate may be aligned, e.g., in a line, to form the edge portion 300-E of the flexible substrate module.

The edge portion 300-E of the flexible substrate module may coincide with the cutting line CL2 when viewed in a plan view, and the edge portion 300-E of the flexible substrate module may have a tolerance of about zero.

Figure 9:
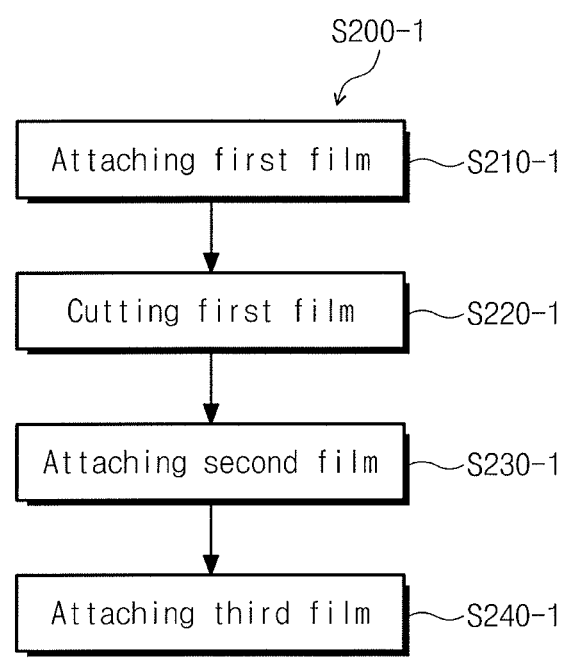
FIG. 9 illustrates a flowchart of a manufacturing method of a display panel according to an exemplary embodiment of the present disclosure.

FIG. 9 illustrates a flowchart of a manufacturing method of a display panel according to an exemplary embodiment of the present disclosure and FIGS. 10A to 10F illustrates cross-sectional views of a manufacturing method of a display panel according to an exemplary embodiment of the present disclosure.

The display panel shown in FIGS. 10A to 10F may correspond to the display panel DP-1 shown in FIG. 5A.

Referring to FIG. 9, attaching the flexible mother substrates (S200-1) may include attaching a first film onto the display substrate (S210-1), cutting the first film (S220-1), attaching a second film (S230-1), and attaching a third film (S240-1).

Figure 10A:
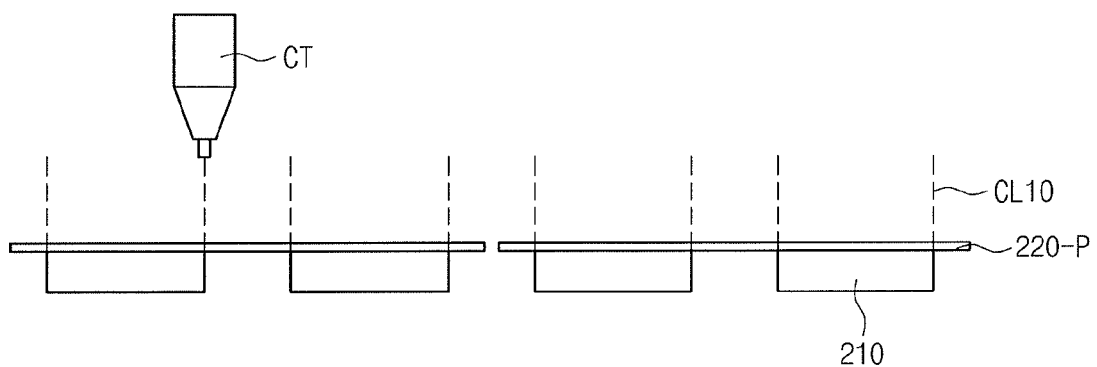
FIGS. 10A to 10F illustrate cross-sectional views of a manufacturing method of a display panel according to an exemplary embodiment of the present disclosure.
Figure 10B:
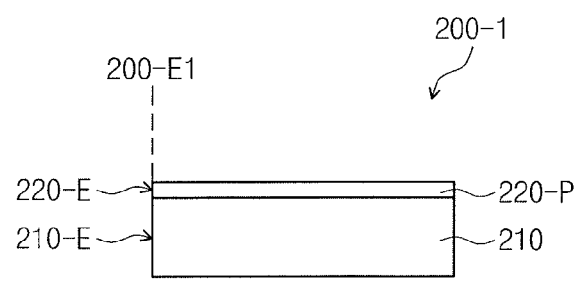

FIGS. 10A and 10B show attaching the first film (S210-1) and cutting the first film (S220-1). Referring to FIGS. 9, 10A, and 10B, the first film 220-P may be provided on the display substrate 210.

The first film 220-P may be provided in a plural number, e.g., in a plurality. The first films may be arranged to be spaced apart from each other when viewed in a plan view. The first films may be respectively provided on the display substrates, or one first film 220-P may be provided to correspond to several display substrates. In the present exemplary embodiment, the first film 220-P may be provided every two display substrates.

The first film 220-P may be cut along a predetermined cutting line CL10. The cutting line CL10 may be defined in an area between the display substrates. In the present exemplary embodiment, the cutting line CL10 may be defined along the edge portion of the display substrate 210.

When the first film 220-P is cut along the cutting line CL10, the display substrate module 200-1 may be formed. The first film 220-P may be cut to form the third flexible substrate 220.

The edge portion 220-E of the third flexible substrate may match with the cutting line CL10. The edge portion 220-E of the third flexible substrate may be aligned with the edge portion 210-E of the display substrate.

The edge portion 200-E1 of the display substrate module may be aligned, e.g., in a line, when viewed in a cross-sectional view. The tolerance between the edge portion 220-E of the third flexible substrate and the edge portion 210-E of the display substrate may become zero.

Figure 10C:
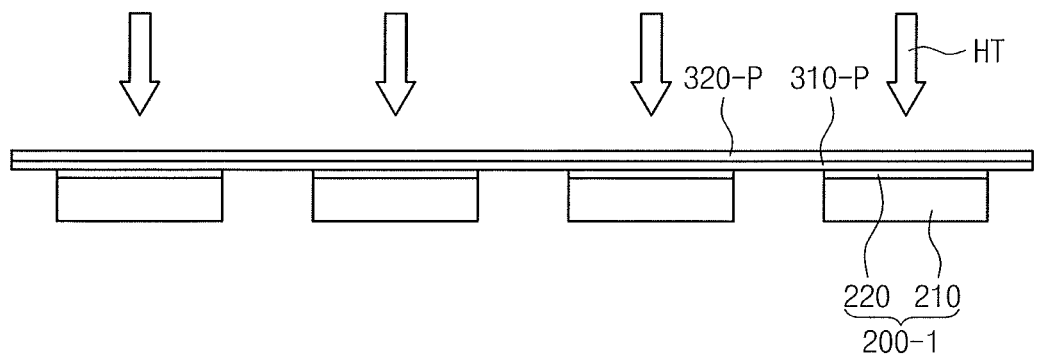
Figure 10D:
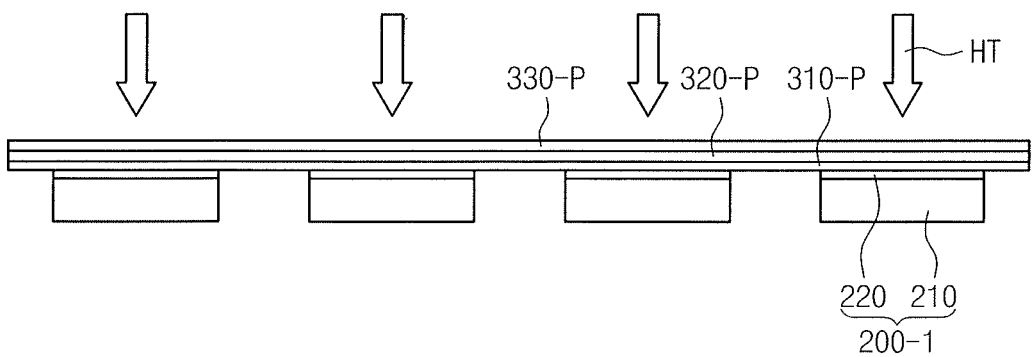

FIGS. 10C and 10D show attaching the second film (S230-1) and attaching the third film (S240-1). Referring to FIGS. 9 and 10C, the second film 310-P and the third film 320-P may be attached to the display substrate module 200-1.

The second film 310-P may correspond to the first film 310P shown in FIG. 8D and the third film 320-P may correspond to the second film 320P shown in FIG. 8D, and the second and third films 310-P and 320-P may be substantially simultaneously laminated after being provided on the display substrate modules.

In an embodiment, the second and third films 310-P and 320-P may be sequentially laminated. For example, the second film 310-P may be attached to the display substrate module 200-1 through the lamination process, and then the third film 320-P may be attached to the second film 310-P.

Referring to FIG. 10D, the manufacturing method of the display panel according to the present exemplary embodiment may further include attaching of a fourth film 330-P. The fourth film 330-P may have the same shape as that of the second and third films 310-P and 320-P.

As shown in FIG. 10D, the fourth film 330-P may be attached to the third film 320-P after the third film 320-P is attached. The fourth film 330-P may be attached to the third film 320-P by a heat HT applied thereto. In an embodiment, the second, third, and fourth films 310-P, 320-P, and 330-P may be substantially simultaneously attached to the display substrate modules through one lamination process after being substantially simultaneously provided.

As another example, the films according to the present exemplary embodiment may be attached to each other by using a predetermined adhesive member, and the lamination process may be omitted.

Figure 10E:
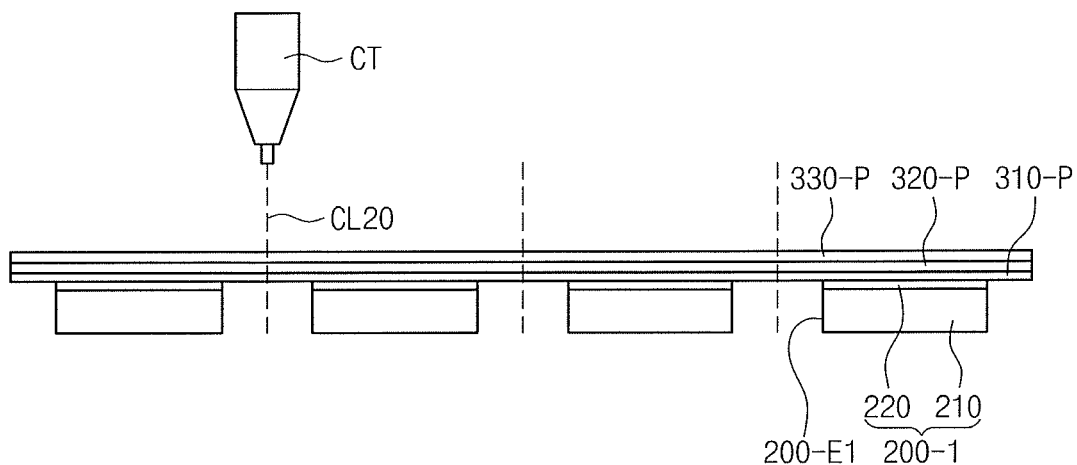
Figure 10F:
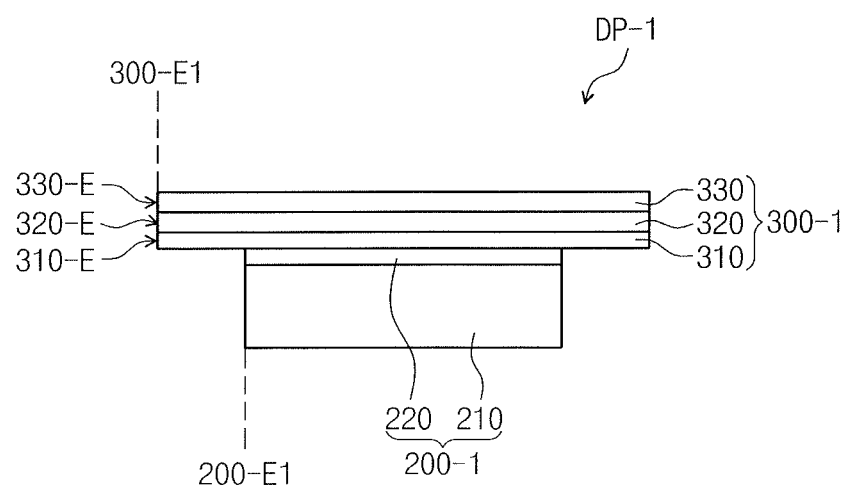

Referring to FIGS. 10E and 10F, the second, third, and fourth films 310-P, 320-P, and 330-P may be cut to form the display panel DP-1. FIG. 10F shows one display panel DP-1 as a representative example.

The second, third, and fourth films 310-P, 320-P, and 330-P may be cut along a cutting line CL20, and the second, third, and fourth films 310-P, 320-P, and 330-P may be substantially simultaneously cut.

The cutting line CL20 may be defined in an area between the display substrate modules. The cutting line CL20 may be provided in a plural number between adjacent two display substrate modules to each other.

The second, third, and fourth films 310-P, 320-P, and 330-P may be cut by a cutting tool CT. The cutting tool CT may correspond to the cutting tool CT shown in FIG. 8E, and detailed descriptions of the cutting tool CT will be omitted.

The second, third, and fourth films 310-P, 320-P, and 330-P may be cut to form the first flexible substrate 310, the second flexible substrate 320, and the fourth flexible substrate 330. The cut portions cut by the cutting tool CT may respectively form the edge portion 310-E of the first flexible substrate, the edge portion 320-E of the second flexible substrate, and the edge portion 330-E of the fourth flexible substrate.

The second, third, and fourth films 310-P, 320-P, and 330-P may be substantially simultaneously cut, and the edge portion 310-E of the first flexible substrate, the edge portion 320-E of the second flexible substrate, and the edge portion 330-E of the fourth flexible substrate may be aligned, e.g., in a line, when viewed in a cross-sectional view.

The edge portion 300-E1 of the flexible substrate module may have a straight line shape when viewed in a cross-sectional view. The tolerance between the edge portion 310-E of the first flexible substrate, the edge portion 320-E of the second flexible substrate, and the edge portion 330-E of the fourth flexible substrate may become substantially zero.

By way of summation and review, the present disclosure relates to a flexible display panel that may have improved tolerance and a method of manufacturing the flexible display panel.

A display device including a flexible display panel may be applied to various electronic devices, such as, for example, a computer monitor, a television set, or a personal mobile device.

For the mobile device, the display device may be downsized. As the size of the display device becomes smaller, a ratio of the outside bezel area to a front surface of the display device may become an important factor in the viewpoint of the design for the display device.

The present disclosure provides a display panel that may have a wide display area and a reduced volume and weight, and the display device including the flexible display panel may be used as a mobile device. Further, the present disclosure provides a display panel that may be capable of realizing a slim bezel design by reducing a tolerance of an edge portion thereof. The present disclosure also provides a method of manufacturing the display panel.

The display panel may include flexible display substrates in which the edge portions may be aligned, e.g., in a line, when viewed in a cross-sectional view, and when the display panel is accommodated in a protective member, the display panel may be assembled in consideration of only one edge portion of one flexible display substrates without considering all the edge portions of the flexible display substrates. Accordingly, the assembling process of the display panel may be simplified and errors on design of the display device may be reduced.

The display panel may include films that may be substantially simultaneously cut to form the flexible display substrates having a tolerance of about zero, and since the edge portions of the flexible display substrates may be substantially simultaneously formed by a cutting process even though the flexible display substrates may be deformed during the lamination process, the manufacturing cost may be reduced and the manufacturing process may be simplified.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display panel, comprising:
providing a plurality of display substrates spaced apart from each other by a predetermined area disposed therebetween, each of the plurality of display substrates including a display area, on which an image is displayed, and each of the plurality of display substrates being flexible;
attaching a first film on the plurality of display substrates to overlap the plurality of display substrates;
attaching a second film on the first film; and
cutting the first and second films along a cutting line to form matched edges of the first and second films and to form a first flexible substrate and a second flexible substrate,
wherein each of the first and second flexible substrates overlaps at least one of the plurality of display substrates,
wherein providing the plurality of display substrates further includes cutting a mother substrate, the mother substrate including a base layer and a plurality of cells on the base layer and spaced apart from each other, each of the cells defining the display area, and
wherein the mother substrate is cut in a unit of the cells to form the plurality of display substrates.

2. The method as claimed in claim 1, wherein an edge portion of the first flexible substrate and an edge portion of the second flexible substrate are aligned with each other.

3. The method as claimed in claim 2, wherein cutting the first and second films includes using a laser beam or pressure.

4. The method as claimed in claim 1, wherein the first film is an optical clear adhesive film.

5. The method as claimed in claim 4, wherein attaching the second film includes:
disposing the second film on the first film; and
applying a heat to the second film to allow the first film to be adhered to the plurality of display substrates and the second film.

6. The method as claimed in claim 5, wherein the second film is a touch panel including a plurality of touch areas disposed to respectively correspond to the plurality of display substrates.

7. The method as claimed in claim 1, further comprising attaching a third flexible substrate to the second film after attaching the second film and before cutting the first and second films, wherein the third flexible substrate is cut with the first and second films.

8. The method as claimed in claim 1, wherein the mother substrate further includes a cover layer on the base layer to cover the cells, and cutting the mother substrate includes cutting the base layer and the cover layer to form the plurality of display substrates respectively covered by cover substrates, the cover substrates formed by cutting the cover layer.

9. The method as claimed in claim 8, wherein:
providing the plurality of display substrates further includes respectively removing the cover substrates from the plurality of display substrates, and
the first film is directly attached to the cells.

10. The method as claimed in claim 8, further comprising:
attaching a third film overlapping the at least one of the plurality of display substrates after providing the plurality of display substrates; and
cutting the third film to form third flexible substrates respectively attached to the plurality of display substrates before attaching the first film, and
wherein the third film is cut along an edge portion of each of the plurality of display substrates.

* * * * *